United States Patent [19]

Bader

[11] 4,430,522

[45] Feb. 7, 1984

[54] LAMINATED BUS BAR WITH CAPACITORS AND METHOD OF MAKING SAME

[75] Inventor: Craig C. Bader, Rochester, N.Y.

[73] Assignee: Eldre Components, Inc., Rochester, N.Y.

[21] Appl. No.: 398,877

[22] Filed: Jul. 16, 1982

[51] Int. Cl.³ .............................................. H01B 7/00
[52] U.S. Cl. .................................... 174/72 B; 29/854
[58] Field of Search ............. 174/72 B; 361/401, 407; 29/854, 855, 856

[56] References Cited

U.S. PATENT DOCUMENTS

| | | | |
|---|---|---|---|
| 4,236,038 | 11/1980 | Taylor | 174/72 B |
| 4,236,046 | 11/1980 | De Vries | 174/72 B |
| 4,266,091 | 5/1981 | Fukuda | 174/72 B |
| 4,343,965 | 8/1982 | Deters et al. | 174/72 B |
| 4,346,257 | 8/1982 | Moss et al. | 174/72 B |

*Primary Examiner*—Laramie E. Askin
*Attorney, Agent, or Firm*—Shlesinger, Fitzsimmons & Shlesinger

[57] ABSTRACT

A thin, dielectric layer of insulation is provided with a plurality of spaced, rectangular openings. At each side of each opening the insulation is provided with a pair of spaced, integral tab portions which project part way into the opening. Rectangularly shaped ceramic capacitors, which are slightly smaller than the rectangular openings, are placed upon the tabs after which the insulation is partially cured to secure the capacitors to the tabs. The layer of insulation is then laminated between a pair of copper strips to produce a laminated bus bar in which the capacitors are secured in the openings with their marginal edges spaced from the surrounding edge of the associated opening, except where the sides of capacitors are engaged by the tabs. Before partially curing the layer of insulation opposite sides of each opening may be spread apart momentarily to allow the capacitors to be centered in the openings, after which the sides of the openings are released so that the tabs resiliently grip opposite side edges of the capacitors to hold them in the openings.

9 Claims, 3 Drawing Figures

LAMINATED BUS BAR WITH CAPACITORS AND METHOD OF MAKING SAME

BACKGROUND OF THE INVENTION

This invention relates to laminated bus bars, and more particularly to the type of laminated bus bars in which small ceramic chip capacitors are secured between the bus bar conductors in order substantially to increase the capacitance of the bars.

Multi-layer laminated bus bars of the type described herein are customarily employed to supply power to the components of electrical circuits of almost any variety. Typically such bars are designed to have the highest possible capacitance. Prior to the introduction of thin, ceramic capacitors, it was customary to provide this desired capacitance by attaching bulk capacitors at selected points to the exterior of the bar, and in certain instances to laminate one or more of the capacitors into the ends of the bar. More recently, however, the preferred process has been to laminate between the adjacent conductors of the bar a plurality of spaced, wafer-thin ceramic capacitors, which typically have a thickness in the range of 7 to 10 mils, and opposed surface areas on the order of a fraction of a square inch. This not only makes the chip difficult to handle, but also tends to complicate the assembly of the bars.

Apart from the difficulties encountered in assemblying the chips in the bars, it heretofore has been the practice to secure the various capacitor chips to the confronting surfaces of the adjacent conductors by the use of an adhesive, which in some cases has been conductive, as suggested for example by U.S. Pat. No. 4,236,046 and No. 4,266,091, and in other cases nonconductive, as taught for example by U.S. Pat. No. 4,236,038. However, as pointed out in the pending patent application of Lee C. Moss et al., Ser. No. 131,523, which was filed Mar. 18, 1980, (now U.S. Pat. No. 4,346,257) and which is owned by the assignee of the instant application, the presence of adhesive between the outer, metalized surfaces of a capacitor and the adjacent conductors will tend to reduce the effectiveness of the capacitors in the associated bus bar. It is therefore desirable to minimize the amount of adhesive which is employed for this purpose, and consequently to increase the proportion of the metalized surfaces of each capacitor which will engage directly with the confronting surfaces of the adjacent conductors.

It is an object of this invention, therefore, substantially to eliminate the need for employing any adhesive between a ceramic capacitor chip and the confronting surfaces of adjacent conductors in laminated bus bars of the type described.

A more specific object of this invention is to provide a bus bar of the type described in which the ceramic chip capacitors are secured in oversized openings in the layer of insulation which separates adjacent conductors in the bar.

A still further object of this invention is to provide an improved manufacturing process which results in maximum utilization of the capacitance afforded by ceramic capacitor chips which are sandwiched between the confronting surfaces of adjacent conductors in laminated bus bars.

Other objects of the invention will be apparent hereinafter from the specification and from the recital of the appended claims, particularly when read in conjunction with the accompanying drawing.

SUMMARY OF THE INVENTION

A chip-bearing substrate is produced by punching a plurality of spaced, rectangular openings in a strip of plastic insulation, which is to be employed for separating adjacent copper strips or conductors in a laminated bus bar. Each of the openings has a pair of small, longitudinally spaced holding tabs projecting from each of its opposed side edges. A small, rectangularly-shaped ceramic chip capacitor, which is slightly shorter and narrower than each opening, is secured centrally in each opening by forcing the chip into the opening between the associated pairs of holding tabs, which thus engage the longitudinal side edges of the chip at spaced points therealong. The outer marginal edges of the chips are thus held in spaced relation to the surrounding edges of the openings in the layer of the plastic, except for the spaced points that are engaged by the holding tabs.

The plastic layer containing the chips is then partially cured, so that a very small amount of adhesive, which is coated on the tabs, flows into engagement with the longitudinal sides of each chip, thereby further to secure each chip in its associated opening. The partially-cured plastic strip is then inserted, by machine if desired, between a pair of copper conductor strips, or the like, which are to form part of a laminated bus bar assembly. The assembly is then laminated between a pair of outer, dielectric sheets, which form a sealed jacket that completely encloses the stacked conductor strips and the intervening capacitor-bearing strips of plastic. For connecting the conductors in a circuit, a plurality of metal tabs project in the usual manner from one or more of the edges of each conductor, and through the surrounding dielectric jacket to the exterior thereof.

THE DRAWING

DETAILED DESCRIPTION OF THE PREFERRED EMBODIMENTS

Figure 1:
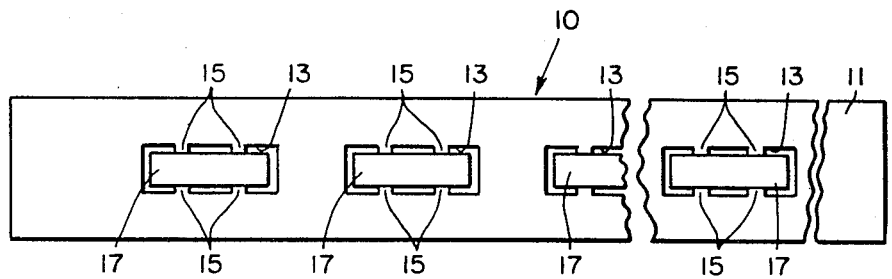
FIG. 1 is a fragmentary plan view of a strip of high capacitance dielectric insulation made according to this invention.

Referring now to the drawing by numerals of reference, and first to FIG. 1, 10 denotes generally an insulating laminate or layer comprising a strip 11 of plastic, dielectric insulation made from a material such as sold, for example, by E. I. DuPont deNemours & Co., Inc. under the trademark or tradename "NOMEX". Projecting from the strip 11 into each opening 13 along each of its two, longitudinally extending side edges is a pair of spaced tabs or projections 15. In the embodiment illustrated the two pairs of tabs 15 in each opening are disposed in spaced, registering relation with each other at opposite sides, respectively, of the opening.

Secured by these two pairs of tabs 15 in each opening 13 is a thin, rectangularly shaped ceramic chip capacitor 17, which may be of the type disclosed, for example, in the above-noted U.S. Pat. No. 4,346,257. Each of these chips 17 may be made, for example, from a barium titanate composition opposite sides of which are metalized or coated with a very thin layer of metal. Moreover, the chips 17 are shorter and narrower than the corresponding rectangular dimensions of the openings 13, but are purposely made slightly wider than the distance between the confronting ends of each pair of tabs 15 in a respective opening or window 13.

The assembly of the chips 17 into the windows 13 can be effected in one of two ways. In the first method the portions of the strip 11 adjacent opposite sides of each window 13 are spread slightly, after which the chips 17 are inserted in the windows, opposite sides of which are then released to spring back toward their original positions, and resiliently to grip the chips between the confronting ends of the two pairs of tabs 15 located in each window. This assembly is then partially cured, or heated, merely to cause a portion of the resin coating on the tabs 15 to flow into engagement with the opposed side edges of the associated chip 17. Upon cooling each chip 17 is then secured in each window 13 in spaced relation to the marginal side edges of the associated window, except where engaged by the tabs 15.

The alternative method of assemblying chips 17 into the windows 13 is to place the chips directly on the confronting ends of the tabs 15 without first spreading opposite sides of each window. Then, with each tab 17 seated on two pairs of spaced tabs 15, the strip 11 is partially cured or heated just long enough to cause the resin on the tab 15 to melt and to adhere to one surface of the chip at four, spaced points thereon.

In the case of either of the above-noted methods, after the chips 17 have been secured in the openings 13, the associated strip 11 can be manipulated for assembly purposes.

Figure 2:
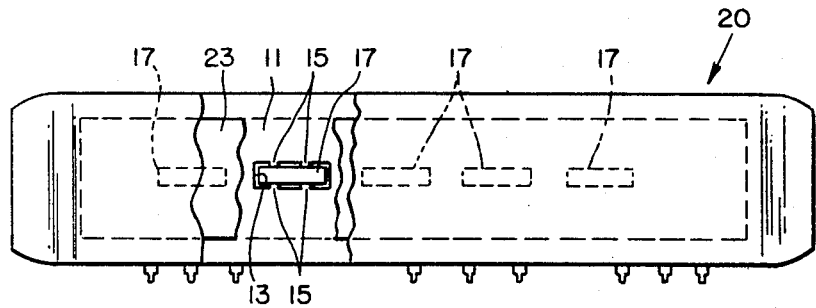
FIG. 2 is a fragmentary plan view of a laminated bus bar made according to one embodiment of this invention, and including strips of dielectric insulation of the type shown in FIG. 1, parts of the bar being cut away for purposes of illustration.
Figure 3:
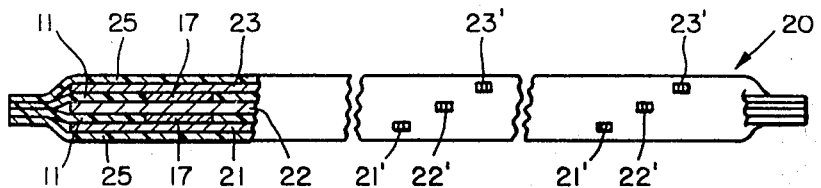
FIG. 3 is a fragmentary side elevation view of this laminated bus bar, and with portions thereof being broken away and shown in section.

In order to assemble the chip-bearing strip 11 into a bus bar, one or more such strips (for example two as shown in FIGS. 2 and 3) are sandwiched between similarly shaped conductor strips, which in practice are usually slightly smaller in overall size than the intervening insulation strips 11. As shown in FIGS. 2 and 3, it is possible to produce a laminated bus bar 20 from these strips 11 by sandwiching a pair thereof between three, elongate, rectangularly-shaped conductors 21, 22 and 23, which have the usual circuit connecting tabs 21', 22' and 23', respectively, projecting from one or more edges thereof. As noted above, the overall size of each strip 11 is greater than that of the associated conductor strips 21-23, so that the strips 11 project beyond the marginal edges of the conductor strips to be laminated in the usual manner with the edges of a pair of outer layers 25 of insulation, which may be made from the same dielectric material as strips 11.

When assembled as shown in FIGS. 2 and 3, the opposed surfaces of the chips 17 will be in direct, electric contact with the confronting surfaces of the adjacent pairs of conductors 21, 22 or 22, 23, thereby substantially increasing the overall capacitance of the laminated bar 20 as compared to prior such bars. Moreover, the outer peripheral edges of each chip 17 will be slightly spaced from the surrounding marginal edge of the associated window or opening 13 except in those areas where the confronting ends of the associated pairs of tabs 15 engage the longitudinal sides edges of the chips. As a consequence, any adhesive or resin which might have been transferred from the tabs 15 to the associated chips 17 will, for the most part, engage only the longitudinal side edges of the respective chips, as distinguished from their opposed, electrically-conductive surfaces. As noted hereinafter, it is this substantially adhesive-free contact between the opposed surfaces of the chips 17 and the confronting, adjacent conductor strips, which finally results in the unexpectedly high capacitance of bar 20 as compared to prior such bars.

Moreover, regardless of the initial assembly method which is employed to assemble the chips 17 into the windows 13, when the actual lamination step takes place, the opposed pairs of tabs 15 in each window 13 are drawn laterally away from opposite sides of the associated chip 17, so that in the final, laminated assembly 20, the chips are spaced from surrounding edges of the associated windows 13 except at the four spaced points where their side edges are engaged by the tips of the associated tabs 15.

To illustrate the improved capacitance which has been achieved by the present invention, a comparison of the capacitance values of bus bars produced by this invention was made with the values of bus bars made in accordance with the teachings in the above-noted U.S. Pat. No. 4,346,257. A first test (Test No. 1) was made of fifteen laminated bus bars made in accordance with said U.S. Pat. No. 4,346,257; and a second test (Test No. 2) was made of fifteen bars made in accordance with the teachings of the present invention. In each test the same, time, temperature and pressure parameters were employed; and each test bar included eight ceramic capacitor chips selected from the same lot. Also for each test the capacitance values per bar were taken at 70° F. before assembly, and at 70° F. twenty-four hours after assembly. The results in microfarads were as follows:

| | TEST NO. 1 | | TEST NO. 2 | |
|---|---|---|---|---|
| BAR NO. | CAP. BEFORE ASSEMBLY (mf) | CAP. 24 HRS. AFTER LAM. (mf) | CAP BEFORE ASSEMBLY (mf) | CAP 24 HR AFTER LAM. (mf) |
| 1 | 0.361 | 0.266 | 0.352 | 0.328 |
| 2 | .347 | short | .355 | .323 |
| 3 | .357 | .253 | .388 | .346 |
| 4 | .374 | .270 | .351 | .315 |
| 5 | .385 | .285 | .341 | .315 |
| 6 | .347 | .257 | .367 | .322 |
| 7 | .405 | .276 | .384 | .348 |
| 8 | .367 | .251 | .361 | .338 |
| 9 | .353 | .247 | .374 | .347 |
| 10 | .357 | .257 | .373 | .353 |
| 11 | .377 | .254 | .362 | .337 |
| 12 | .368 | .253 | .388 | .362 |
| 13 | .340 | .243 | .380 | .354 |
| 14 | .377 | .283 | .373 | .350 |
| 15 | .370 | .266 | .359 | short |

The test results indicate that, where the drop in capacity of the bars made in accordance with the teachings of said U.S. Pat. No. 4,346,257 was in the range of 29%, it was only on the order of about 8% for the bars made according to the teachings of this invention. Each test was conducted using an Electro Scientific Industries Model #252 Impedance Meter. Prior to assembly the eight chips to be used in a respective bar were tested to determine their collective capacitance; and twenty-four hours after the assembly and lamination of these chips into a bar, the capacitance of the latter was tested in a standard manner on the above-noted equipment to provide a figure for comparison with the collective capacitance determined prior to assembly.

From the foregoing it will be apparent that the present invention provides improved high capacitance bus bars that are relatively simple to assemble, and extremely reliable in operation. By eliminating the presence of an adhesive between the chips and the confronting surfaces of adjacent conductors, not only is the cost per bar reduced, but also its capacitance is substantially increased.

And while this invention has been illustrated and described in connection with a layer of insulation having two projections on each side of a window 13, it will be apparent that the number and disposition of these tabs or projections can be changed without departing from this invention. Moreover, it will be apparent that each bar need only contain two or more conductor strips to form a high capacitance bar in accordance with this invention, and that the three strips 21–23 were selected merely for purposes of illustration.

Also, instead of heating the entire strip 11 and the chips 17 thereon, it would be possible partially to cure this assembly simply by heating the chips 17 themselves, rather than the entire strip 11, or by using a liquid solvent to dissolve the resin coating on strip 11 in the areas of the tabs 15. In each case the adhesive on the tabs 15 would be melted sufficiently to adhere to the edges of the chips. Furthermore, this application is intended to cover any further modification which may fall within the scope of one skilled in the art or the appended claims.

What I claim is:

1. A method of producing a laminated bus bar, comprising
   providing a resin-coated layer of plastic, dielectric material having therethrough a plurality of spaced openings, and having formed thereon around each opening a plurality of spaced, integral tabs which project part way into the opening,
   placing over each of said openings and its associated tabs a thin capacitor, which is similar in configuration to but smaller than the associated opening, and whereby marginal portions of each capacitor at one side thereof are supported on said associated tabs adjacent the inner ends thereof,
   partially curing said layer to secure the capacitors thereto, and
   laminating said layer and capacitors between a pair of strip conductors to form a bus bar in which said capacitors are secured in said openings with opposite sides thereof engaged with said conductors, and with marginal portions of their peripheries engaged by said inner ends of the associated tabs.

2. A method as defined in claim 1, including placing each capacitor in the associated opening in said dielectric layer before partially curing said layer, and in such manner that each capacitor is resiliently gripped between the inner ends of the associated tabs.

3. A method as defined in claim 2, including spreading the sides of said layer adjacent each opening to enable placement of each capacitor between the inner ends of the associated tabs.

4. A laminated bus bar, comprising
   a pair of electrically conductive metal strips,
   a layer of dielectric insulation laminated between said strips, and
   at least one thin capacitor secured in an opening in said layer with opposite sides thereof in contact with the confronting surfaces on said strips,
   said capacitor being generally similar in configuration to and slightly smaller than said opening, and
   said layer having formed thereon around the periphery of said opening a plurality of spaced, integral tabs which project into engagement with the periphery of said capacitor at spaced points thereabout.

5. A laminated bus bar as defined in claim 4, wherein between said spaced points the outer peripheral surface of said capacitor confronts upon and is spaced from the surrounding periphery of said opening.

6. A laminated bus bar as defined in claim 5, wherein
   said opening and said capacitor are generally rectangular in configuration, and
   two pairs of spaced tabs project into said opening from opposite sides, respectively, thereof, and into engagement with opposite side edges, respectively, of said capacitor at spaced points therealong.

7. A laminated bus bar as defined in claim 6, wherein said dielectric layer has therein a plurality of said rectangularly shaped openings, and each of a plurality of said capacitors is secured in one of said openings with its side and end edges spaced from the surrounding periphery of the associated opening except where engaged by said tabs.

8. A laminated bus bar as defined in claim 4, wherein at least two tabs are formed on said layer to project into said opening from opposite sides thereof, and into engagement with opposed side edges of said capacitor.

9. A laminated bus bar as defined in claim 8, wherein two pairs of spaced tabs project from opposite sides, respectively, of said opening into engagement with opposite side edges, respectively, of said capacitor.

* * * * *